United States Patent
Chen

(10) Patent No.: US 10,938,364 B2
(45) Date of Patent: Mar. 2, 2021

(54) VACUUM TUBE SUBWOOFER EXTRACTION CIRCUIT SYSTEM

(71) Applicant: ECHOWELL ELECTRONIC CO., LTD., New Taipei (TW)

(72) Inventor: Hsi-Hsien Chen, New Taipei (TW)

(73) Assignee: ECHOWELL ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 16/454,310

(22) Filed: Jun. 27, 2019

(65) Prior Publication Data
US 2020/0412312 A1    Dec. 31, 2020

(51) Int. Cl.
*H03G 9/00* (2006.01)
*H03G 3/30* (2006.01)
*H03G 7/00* (2006.01)
*G10H 3/14* (2006.01)
*H03F 3/181* (2006.01)
*H03H 7/01* (2006.01)
*H03F 3/21* (2006.01)

(52) U.S. Cl.
CPC .......... *H03G 3/3005* (2013.01); *G10H 3/14* (2013.01); *H03F 3/181* (2013.01); *H03F 3/21* (2013.01); *H03G 7/004* (2013.01); *H03H 7/0161* (2013.01); *H03F 2200/549* (2013.01)

(58) Field of Classification Search
CPC ...................................................... H03G 9/00
See application file for complete search history.

(56) References Cited

U.S. PATENT DOCUMENTS

| | | | | |
|---|---|---|---|---|
| 4,241,313 A | * | 12/1980 | Takehara | H03F 3/185 330/253 |
| 4,597,100 A | * | 6/1986 | Grodinsky | H04R 3/14 381/99 |
| 5,268,527 A | * | 12/1993 | Waller, Jr. | G10H 1/12 381/61 |
| 5,648,664 A | * | 7/1997 | Rough | H01L 29/8083 257/135 |
| 5,734,725 A | * | 3/1998 | Pritchard | G10H 1/16 381/123 |
| 5,761,317 A | * | 6/1998 | Pritchard | H03G 7/08 330/102 |
| 5,789,689 A | * | 8/1998 | Doidic | G10H 1/125 341/138 |
| 5,805,713 A | * | 9/1998 | Pritchard | G10H 1/16 330/262 |

(Continued)

*Primary Examiner* — Olisa Anwah
(74) *Attorney, Agent, or Firm* — Locke Lord LLP; Tim Tingkang Xia, Esq.

(57) ABSTRACT

A vacuum tube subwoofer extraction circuit system includes: a front-end circuit; and a vacuum tube subwoofer extraction circuit connected to the front-end circuit, the vacuum tube subwoofer extraction circuit including: a small signal amplification vacuum tube for receiving an input signal from the front-end circuit and outputting an audio signal; and a passive filtering circuit connected to the small signal amplification vacuum tube and adapted to perform a filtering process on the audio signal so as to output a filtered signal, wherein the front-end circuit includes a switch power circuit for providing low voltage to the vacuum tube subwoofer extraction circuit, wherein the small signal amplification vacuum tube does not have gain effect on the input signal.

7 Claims, 7 Drawing Sheets

(56) References Cited

U.S. PATENT DOCUMENTS

| | | | | |
|---|---|---|---|---|
| 6,111,961 | A * | 8/2000 | Hedrick | G10H 3/186 |
| | | | | 381/120 |
| 6,175,271 | B1 * | 1/2001 | Mieda | H03F 3/20 |
| | | | | 330/195 |
| 9,306,510 | B1 * | 4/2016 | Robling | G10H 3/187 |
| 2004/0090263 | A1 * | 5/2004 | Harner | H03F 5/00 |
| | | | | 330/3 |
| 2010/0303263 | A1 * | 12/2010 | Hiensch | H04R 19/02 |
| | | | | 381/191 |

* cited by examiner

VACUUM TUBE SUBWOOFER EXTRACTION CIRCUIT SYSTEM

BACKGROUND OF THE INVENTION

Field of the Invention

The present disclosure relates to a vacuum tube subwoofer extraction circuit system and, more particularly, to a vacuum tube subwoofer extraction circuit system using a switch power circuit.

Description of the Prior Art

Switch Mode Power Supply (SMPS) is inapplicable to conventional vacuum tube loops. It is because switch power includes pulse width modulation (PWM) signals, and the signals cause high-frequency noise to the vacuum tube. The noise is eventually amplified. Furthermore, conventional vacuum tube loop operates at voltage of 100 V DC-250 V DC, and thus it cannot use switch power. Under this condition, a single high-voltage power supply poses issues, namely design difficulty and high cost, to a subwoofer system. In addition, it is impossible to reduce power and safety cost with external switch power. In view of this, there is a demand for a vacuum tube subwoofer extraction circuit system which not only uses a switch power circuit but also filters out the generated high-frequency noise.

SUMMARY OF THE INVENTION

To overcome the aforesaid drawback of the prior art, an aspect of the present disclosure provides a vacuum tube subwoofer extraction circuit system which not only uses a switch power circuit but also filters out the generated high-frequency noise.

In the aforesaid aspect, the present disclosure provides a vacuum tube subwoofer extraction circuit system, comprising: a front-end circuit; and a vacuum tube subwoofer extraction circuit connected to the front-end circuit, the vacuum tube subwoofer extraction circuit comprising: a small signal amplification vacuum tube for receiving an input signal from the front-end circuit and outputting an audio signal; and a passive filtering circuit connected to the small signal amplification vacuum tube and adapted to perform a filtering process on the audio signal so as to output a filtered signal, wherein the front-end circuit comprises a switch power circuit for providing low voltage to the vacuum tube subwoofer extraction circuit, wherein the small signal amplification vacuum tube does not have gain effect on the input signal.

In a preferred embodiment of the present disclosure, the small signal amplification vacuum tube functions as a vacuum tube cathode follower.

In a preferred embodiment of the present disclosure, the vacuum tube subwoofer extraction circuit comprises a second small signal amplification vacuum tube connected behind to the passive filtering circuit to receive the filtered signal and output a second audio signal.

In a preferred embodiment of the present disclosure, the second small signal amplification vacuum tube functions as a vacuum tube cathode follower and does not have gain effect on the filtered signal.

In a preferred embodiment of the present disclosure, the vacuum tube subwoofer extraction circuit system further comprises an amplifier circuit connected to the vacuum tube subwoofer extraction circuit and adapted to amplify output power of an output signal from the vacuum tube subwoofer extraction circuit.

In a preferred embodiment of the present disclosure, the amplifier circuit bridges to and loads (bridge-tied load) an amplifier circuit.

In a preferred embodiment of the present disclosure, the front-end circuit comprises a voltage divider circuit, the voltage divider circuit divides the voltage provided by the switch power circuit, and provides the divided voltage to the small signal amplification vacuum tube and the second small signal amplification vacuum tube.

The present disclosure is rendered comprehensible and clear after its aforesaid aspects and any other aspects are illustrated by non-restrictive, specific embodiments below and depicted by accompanying drawings.

DETAILED DESCRIPTION OF THE EMBODIMENTS

Figure 1:
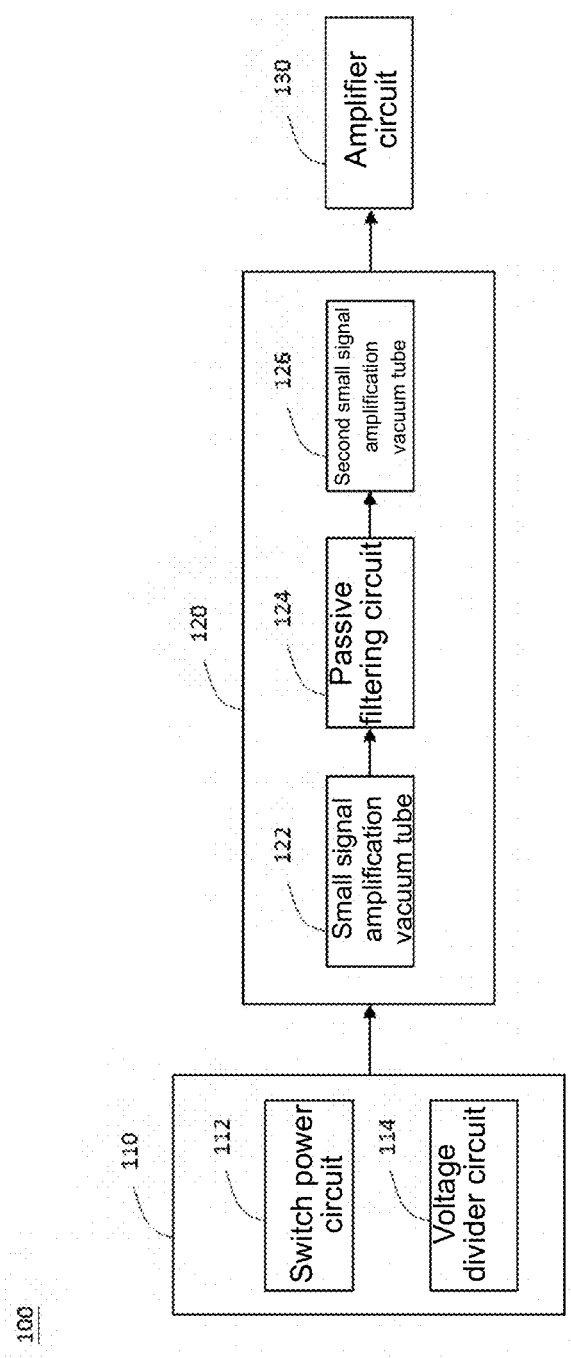
FIG. 1 is a block diagram of a vacuum tube subwoofer extraction circuit system according to a specific embodiment of the present disclosure.

Referring to FIG. 1, there is shown a block diagram of a vacuum tube subwoofer extraction circuit system according to a specific embodiment of the present disclosure. Referring to FIG. 1, a vacuum tube subwoofer extraction circuit system 100 comprises a front-end circuit 110, a vacuum tube subwoofer extraction circuit 120 and an amplifier circuit 130. The vacuum tube subwoofer extraction circuit 120 is connected behind to the front-end circuit 110. The amplifier circuit 130 is connected behind to the vacuum tube subwoofer extraction circuit 120. The front-end circuit 110 further comprises a switch power (Switch Mode Power Supply, SMPS) circuit 112 and a voltage divider circuit 114. The vacuum tube subwoofer extraction circuit 120 further comprises a small signal amplification vacuum tube 122, a passive filtering circuit 124 and a second small signal amplification vacuum tube 126. The passive filtering circuit 124 is connected behind to the small signal amplification vacuum tube 122. The second small signal amplification vacuum tube 126 is connected behind to the passive filtering circuit 124. In a specific embodiment, the vacuum tube subwoofer extraction circuit only includes a small signal amplification vacuum tube and a passive filtering circuit.

The second small signal amplification vacuum tube is independently located in another circuit.

In the embodiment illustrated by FIG. 1, the voltage divider circuit 114 of the front-end circuit 110 divides the voltage which the switch power circuit 112 provides to the vacuum tube subwoofer extraction circuit 120 and then provides the divided voltage to the small signal amplification vacuum tube 122 and the second small signal amplification vacuum tube 126. The small signal amplification vacuum tube 122 receives an input signal from the front-end circuit 110 and processes the input signal so as to output an audio signal. The passive filtering circuit 124 performs a filtering process on the audio signal to thereby output a filtered signal. The second small signal amplification vacuum tube 126 receives and processes the filtered signal to thereby output a second audio signal. The amplifier circuit 130 amplifies output power of an output signal from the vacuum tube subwoofer extraction circuit 120 (i.e., the second audio signal output from the second small signal amplification vacuum tube 126 in this embodiment). In a specific embodiment, the voltage which the switch power circuit 112 provides to the small signal amplification vacuum tube 122 and the second small signal amplification vacuum tube 126 of the vacuum tube subwoofer extraction circuit 120 is low voltage. For instance, the low voltage provided by the switch power circuit 112 is less than 20 V.

In a specific embodiment, the small signal amplification vacuum tube 122 and the second small signal amplification vacuum tube 126 are three-terminal 12AU7 vacuum tubes, but the present disclosure is not limited thereto. Only two of terminals of the small signal amplification vacuum tube 122 are operating and do not have any gain effect. Only two of terminals of the second small signal amplification vacuum tube 126 are operating and do not have any gain effect. Hence, the vacuum tube subwoofer extraction circuit system 100 can operate at low voltage. In another specific embodiment, the amplifier circuit 130 is provided in the form of TL072 chip, TDA7375 chip and/or TDA7377 chip, but the present disclosure is not limited thereto. In a specific embodiment, the amplifier circuit 130 bridges to and loads (BTL) an amplifier circuit and uses high current driving to elevate dynamic low-pitch singlet, allowing vacuum tube subwoofer extraction to be carried out with the external switch power circuit 112.

In the embodiment illustrated by FIG. 1, the small signal amplification vacuum tube 122 functions as a vacuum tube cathode follower; in the vacuum tube subwoofer extraction circuit system 100, the small signal amplification vacuum tube 122 does not have gain effect on the input signal. Furthermore, the second small signal amplification vacuum tube 126 also functions as a vacuum tube cathode follower; in the vacuum tube subwoofer extraction circuit system 100, the second small signal amplification vacuum tube 126 does not have gain effect on the filtered signal. Since the small signal amplification vacuum tube 122 and the second small signal amplification vacuum tube 126 do not have any gain function in the vacuum tube subwoofer extraction circuit system 100, they minimize the required voltage, allowing this circuit to use the switch power circuit 112 as a voltage provider. In addition, since the required voltage of the vacuum tube subwoofer extraction circuit system 100 is low, it can reduce safety-related expenses, thereby cutting cost. Moreover, since the small signal amplification vacuum tube 122 and the second small signal amplification vacuum tube 126 each function as a vacuum tube cathode follower, their high input impedance and low output impedance ensure design accuracy of the passive filtering circuit 124.

Figure 2:
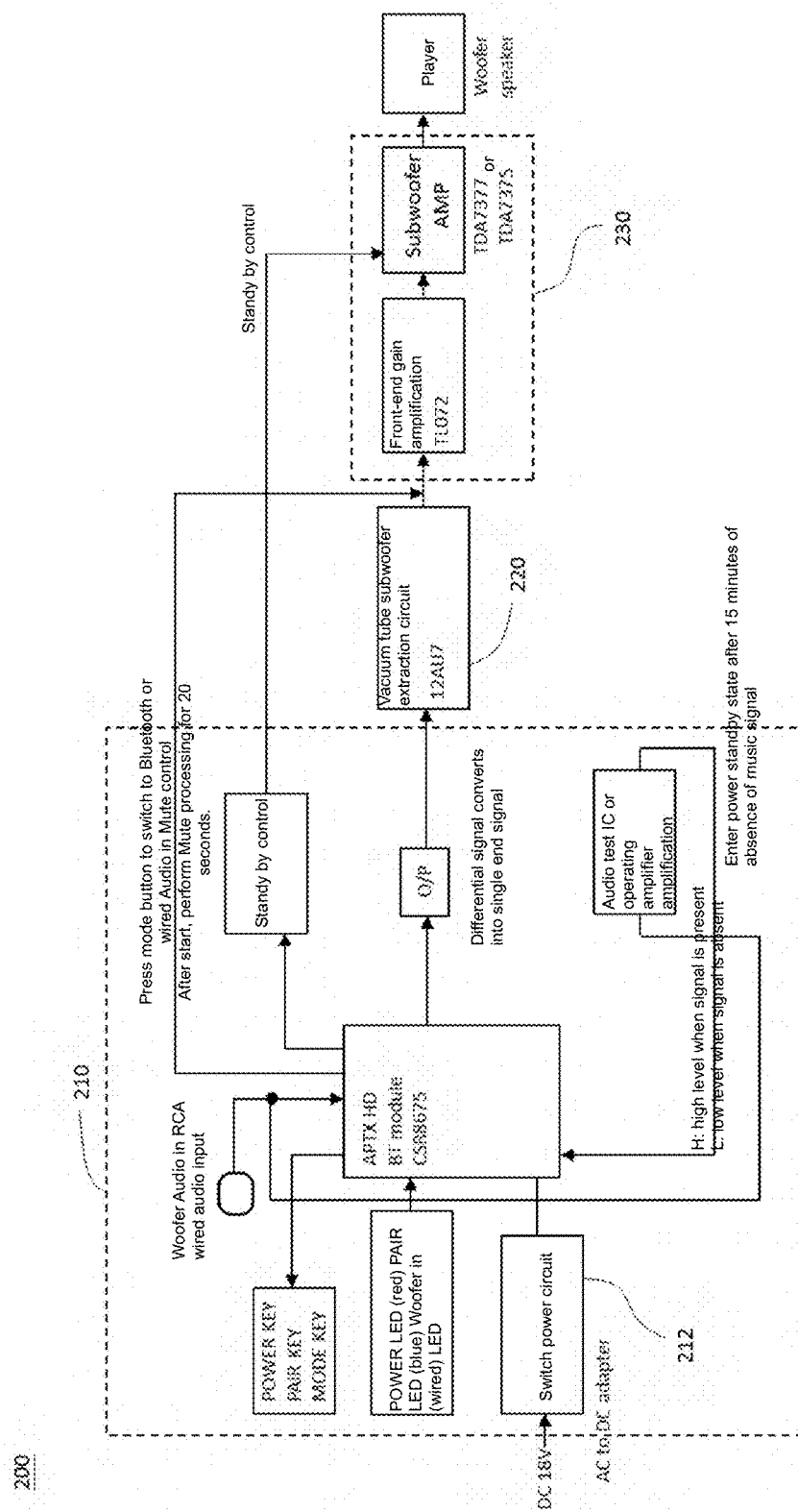
FIG. 2 is a block diagram of the vacuum tube subwoofer extraction circuit system according to another specific embodiment of the present disclosure.

Referring to FIG. 2, there is shown a block diagram of the vacuum tube subwoofer extraction circuit system according to another specific embodiment of the present disclosure. In the embodiment illustrated by FIG. 2, the vacuum tube subwoofer extraction circuit system 200 is for use in a subwoofer system. In the vacuum tube subwoofer extraction circuit system 200, the front-end circuit 210 uses the switch power circuit 212 to provide voltage. The vacuum tube subwoofer extraction circuit 220 of the vacuum tube subwoofer extraction circuit system 200 uses low voltage power supply to design 12AU7 vacuum tube. The vacuum tube subwoofer extraction circuit 220 comprises a small signal amplification vacuum tube, a passive RC low-pass filter and a second small signal amplification vacuum tube (internal configuration of the vacuum tube subwoofer extraction circuit 220 is exemplified by the vacuum tube subwoofer extraction circuit 120 in FIG. 1).

In a specific embodiment, to prevent the vacuum tube high-frequency noise generated by the pulse width modulation (PWM) signal included in the switch power circuit 212 from being amplified (the small signal amplification vacuum tube and the second small signal amplification vacuum tube of the vacuum tube subwoofer extraction circuit 220 do not have any gain effect), the amplifier circuit 230 of the vacuum tube subwoofer extraction circuit system 200 amplifies output power of the output signal from the vacuum tube subwoofer extraction circuit 220. The vacuum tube subwoofer extraction circuit 220 uses a passive filtering circuit between the small signal amplification vacuum tube and the second small signal amplification vacuum tube to perform a filtering process so as to filter out the vacuum tube high-frequency noise generated by the PWM signal.

Figure 3A:
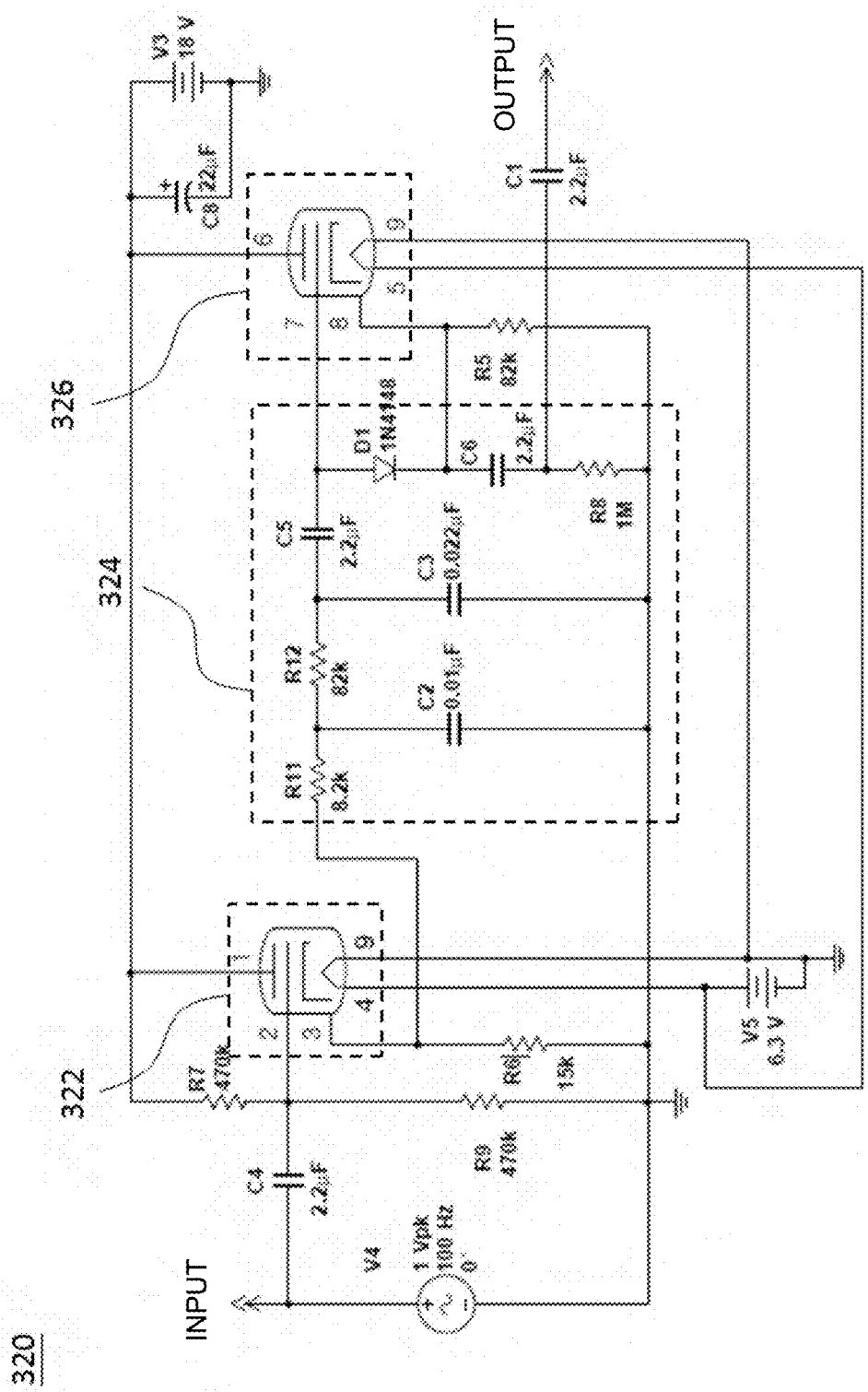
FIG. 3A is a circuit diagram of the vacuum tube subwoofer extraction circuit according to a specific embodiment of the present disclosure.
Figure 3B:
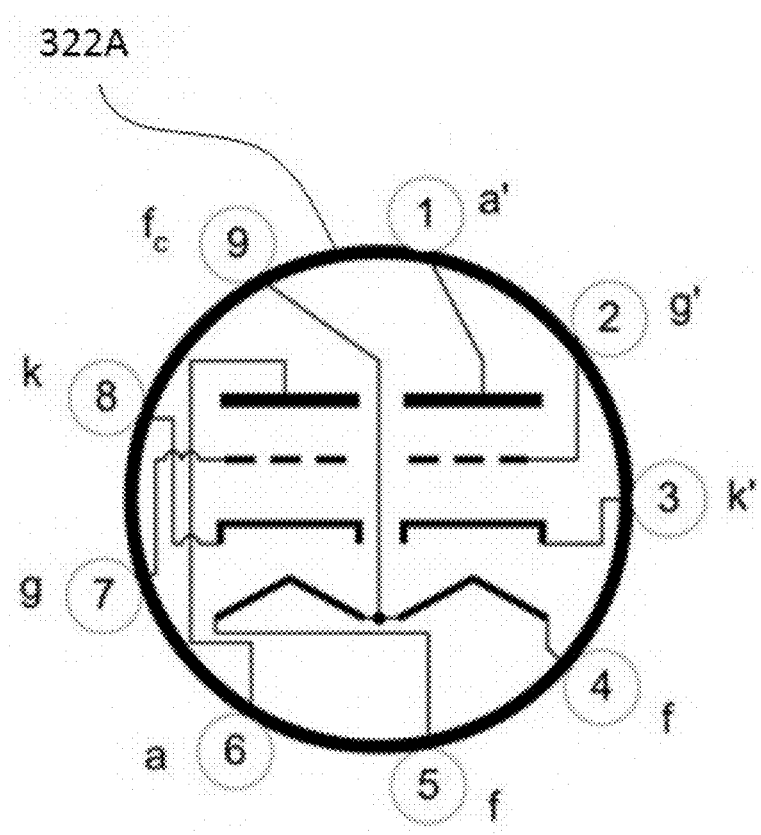
FIG. 3B is a schematic view of a small signal amplification vacuum tube according to a specific embodiment of the present disclosure, showing its pin numbers.

Referring to FIG. 3A, there is shown a circuit diagram of the vacuum tube subwoofer extraction circuit according to a specific embodiment of the present disclosure. In the embodiment illustrated by FIG. 3A, only two of the terminals of each of a small signal amplification vacuum tube 322 and a second small signal amplification vacuum tube 326 of a vacuum tube subwoofer extraction circuit 320 are operating and do not have any gain effect. A filtering circuit 324 is disposed between the small signal amplification vacuum tube 322 and the second small signal amplification vacuum tube 326 and adapted to perform a filtering process on the audio signal from the small signal amplification vacuum tube 322. Referring to FIG. 3B, there is shown a schematic view which shows the pin numbers of the pins of the 12AU7 small signal amplification vacuum tube 322A. The pin numbers of the small signal amplification vacuum tube 322 and the second small signal amplification vacuum tube 326 shown in FIG. 3A correspond to the pin numbers of the small signal amplification vacuum tube 322A shown in FIG. 3B.

Figure 4A:
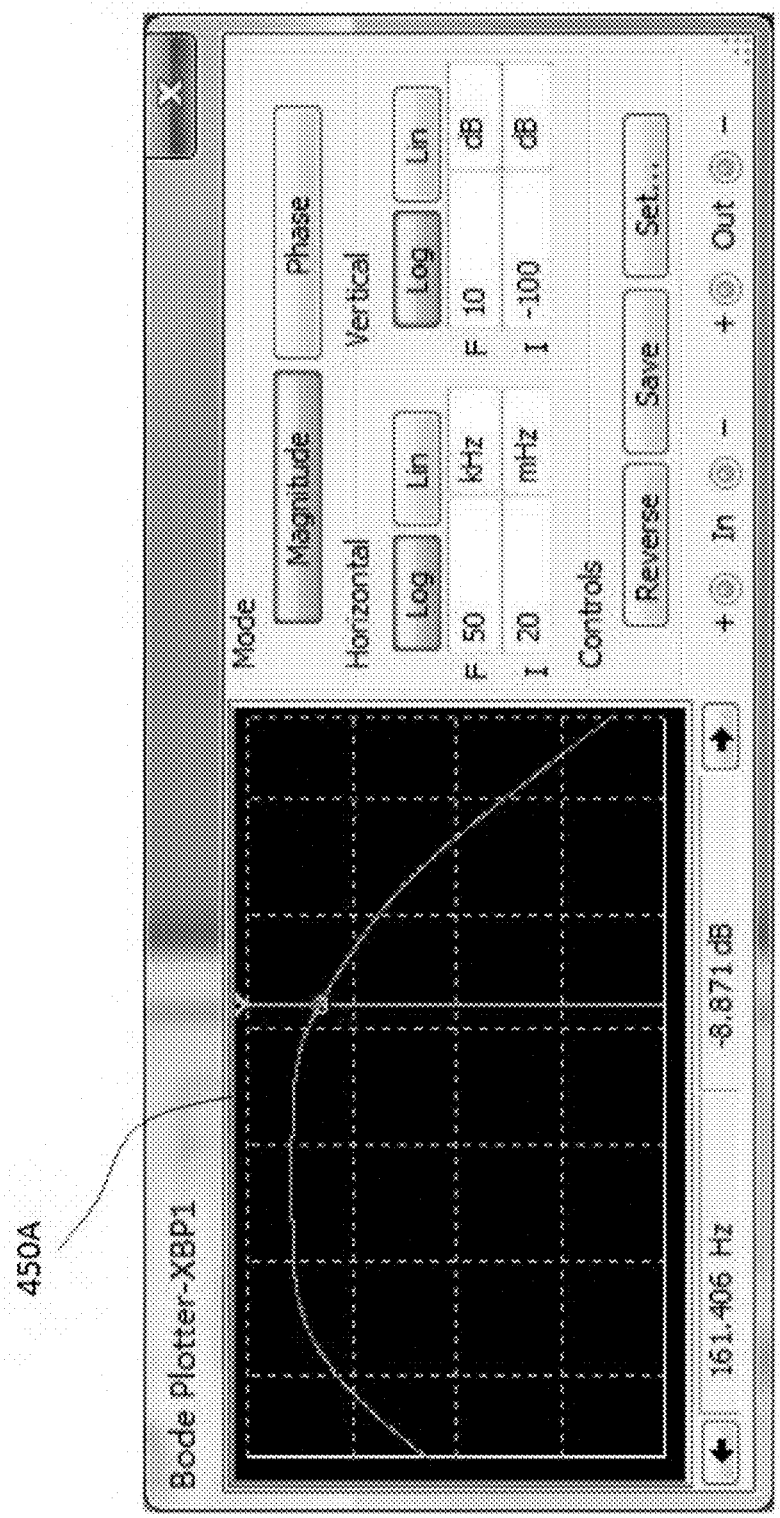
FIG. 4A is a Bode Plot of the vacuum tube subwoofer extraction circuit according to a specific embodiment of the present disclosure.
Figure 4B:
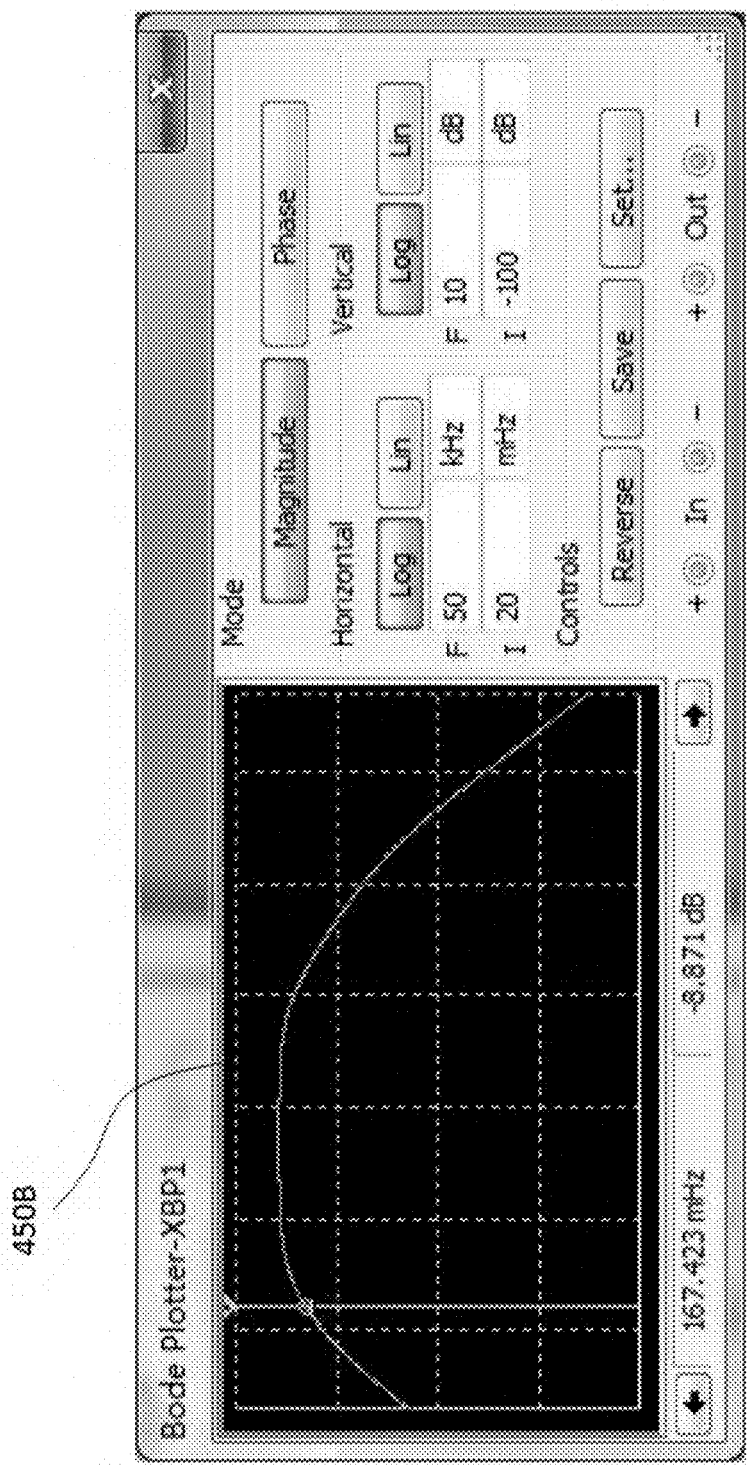
FIG. 4B is a Bode Plot of the vacuum tube subwoofer extraction circuit according to another specific embodiment of the present disclosure.
Figure 4C:
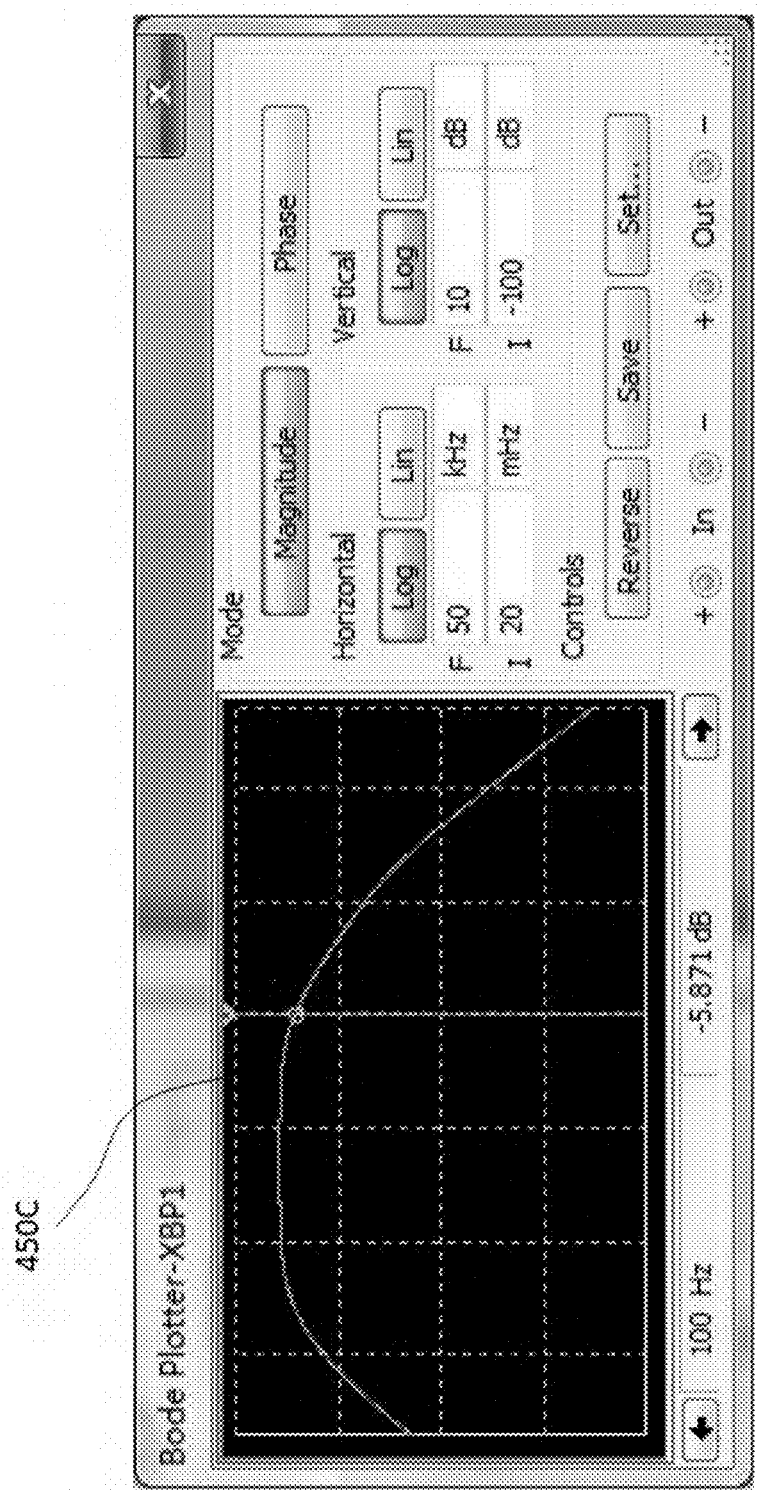
FIG. 4C is a Bode Plot of the vacuum tube subwoofer extraction circuit according to yet another specific embodiment of the present disclosure.

Referring to FIG. 4A through FIG. 4C, there are shown Bode Plots of the vacuum tube subwoofer extraction circuit in different specific embodiments. The Bode Plot 450A shown in FIG. 3A indicates that high-frequency signals (with frequency greater than 161.406 Hz) are filtered out. The Bode Plot 450B shown in FIG. 3B indicates that inaudible ultra-low-frequency signals (with frequency less than 167.423 mHz) are filtered out. The Bode Plot 450C shown in FIG. 3C indicates that high-frequency signals (with frequency greater than 100 Hz) are filtered out. FIG. 4A through FIG. 4C show that in these specific embodiments, the vacuum tube subwoofer extraction circuit reduce PWM signals of the switch power circuit greatly.

The vacuum tube subwoofer extraction circuit system of the present disclosure is described above and depicted by the accompanying drawings. The embodiments of the present invention are merely illustrative of the present disclosure. Persons skilled in the art may make various changes to the embodiments of the present disclosure without departing from the spirit and scope of the present disclosure, and the changes must be deemed falling within the scope of the present disclosure. Hence, the embodiments of the present disclosure are not restrictive of the present invention. Therefore, the scope of the protection of rights of the present disclosure shall be defined by the appended claims.

What is claimed is:

1. A vacuum tube subwoofer extraction circuit system, comprising:
    a front-end circuit; and
    a vacuum tube subwoofer extraction circuit connected to the front-end circuit, the vacuum tube subwoofer extraction circuit comprising:
        a small signal amplification vacuum tube for receiving an input signal from the front-end circuit and outputting an audio signal; and
        a passive filtering circuit connected to the small signal amplification vacuum tube and adapted to perform a filtering process on the audio signal so as to output a filtered signal,
    wherein the front-end circuit comprises a switch power circuit for providing low voltage to the vacuum tube subwoofer extraction circuit,
    wherein the small signal amplification vacuum tube does not have gain effect on the input signal.

2. The vacuum tube subwoofer extraction circuit system of claim 1, wherein the small signal amplification vacuum tube functions as a vacuum tube cathode follower.

3. The vacuum tube subwoofer extraction circuit system of claim 1, wherein the vacuum tube subwoofer extraction circuit comprises a second small signal amplification vacuum tube connected behind to the passive filtering circuit to receive the filtered signal and output a second audio signal.

4. The vacuum tube subwoofer extraction circuit system of claim 3, wherein the second small signal amplification vacuum tube functions as a vacuum tube cathode follower and does not have gain effect on the filtered signal.

5. The vacuum tube subwoofer extraction circuit system of claim 1, further comprising an amplifier circuit connected to the vacuum tube subwoofer extraction circuit and adapted to amplify output power of an output signal from the vacuum tube subwoofer extraction circuit.

6. The vacuum tube subwoofer extraction circuit system of claim 5, wherein the amplifier circuit bridges to and loads an amplifier circuit.

7. The vacuum tube subwoofer extraction circuit system of claim 1, wherein the front-end circuit comprises a voltage divider circuit, the voltage divider circuit divides the voltage provided by the switch power circuit, and provides the divided voltage to the small signal amplification vacuum tube and the second small signal amplification vacuum tube.

* * * * *